United States Patent [19]
Dull et al.

[11] Patent Number: 5,650,249
[45] Date of Patent: Jul. 22, 1997

[54] METHOD FOR MAKING PRECISION RADOMES

[75] Inventors: Dennis L. Dull, Sumner; David G. Jensen, Auburn; Daniel R. Tichenor, Kent, all of Wash.

[73] Assignee: The Boeing Company, Seattle, Wash.

[21] Appl. No.: 464,252

[22] Filed: Jun. 5, 1995

Related U.S. Application Data

[63] Continuation-in-part of Ser. No. 147,183, Nov. 3, 1993, Pat. No. 5,468,409, and a continuation-in-part of Ser. No. 315,993, Sep. 30, 1994, Pat. No. 5,552,249, which is a division of Ser. No. 978,322, Nov. 18, 1992, Pat. No. 5,395,718.

[51] Int. Cl.$^6$ ........................................ G03F 9/00
[52] U.S. Cl. .................. 430/5; 430/311; 430/313; 430/258; 343/708; 343/873; 343/909
[58] Field of Search ........................ 430/5, 311, 313, 430/323, 258; 343/708, 873, 909

[56] References Cited

U.S. PATENT DOCUMENTS

| | | | |
|---|---|---|---|
| 3,753,818 | 8/1973 | Poor et al. | 156/19 |
| 4,388,388 | 6/1983 | Kornbau et al. | 430/258 |
| 4,696,717 | 9/1987 | Bissinger | 156/642 |
| 5,298,117 | 3/1994 | Hanson et al. | 156/666 |
| 5,344,729 | 9/1994 | Akins et al. | 430/5 |
| 5,352,565 | 10/1994 | Schroeder | 430/320 |

FOREIGN PATENT DOCUMENTS 2149-684-A 6/1990 Japan.

OTHER PUBLICATIONS

Brochure entitled: "*Laserdyne Model 890 BeamDirector*," Laserdyne Division, Lumonics Corporation, Eden Prairie, MN, 1990.

Brochure entitled: "*Laserdyne Models 780 and 780 Beam-Director,*" Laserdyne Products, Lumonics Laser Systems Group, Eden Prairie, MN, 1990.

Brochure entitled: "*Florod Laser Systems For Microelectronics*," Florod Corp., Gardena, CA, 1988.

Brochure entitled: "*UFE Molded Circuit Technology*," UFE, Inc., Stillwater, MN (undated).

*New Products*, Feb. 1991, pp. 7 & 8.

Brochure entitled: "*Model LFA-308 Excimer Laser Cutter,*" Florod Corp., Gardena, CA, 1991.

*Primary Examiner*—S. Rosasco
*Attorney, Agent, or Firm*—John C. Hammar

[57] ABSTRACT

Radomes having complexly curved, frequency selective surfaces are made with a high degree of precision to assure part-to-part uniformity in electrical performance using a three-dimensional conformal mask and a precision etch process. The mask has a transparent substrate and a patterned opaque layer on the substrate. We expose photosensitive material overlying a thin film metal layer (generally deposited on a dielectric) through the mask. Metal exposed by patterning the photosensitive material is etched with a $CuCl_2$ and chloride salt solution, and the remainder of the layer of photosensitive material is removed to complete the patterning.

20 Claims, 12 Drawing Sheets

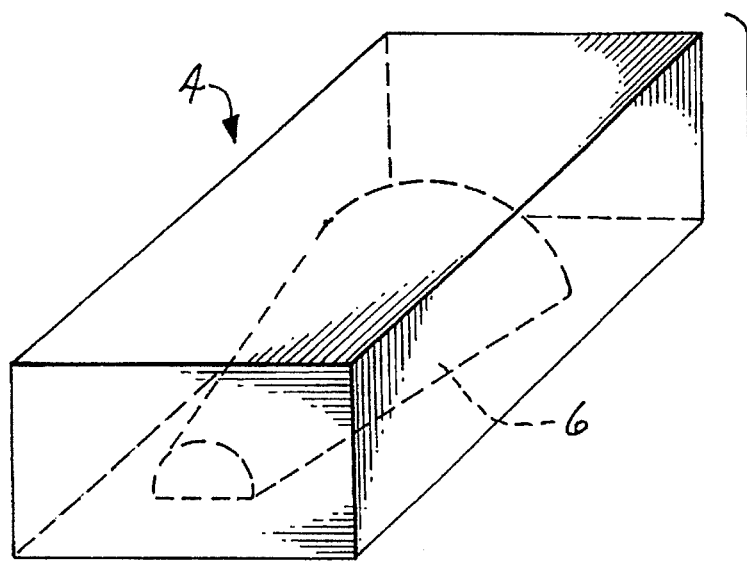
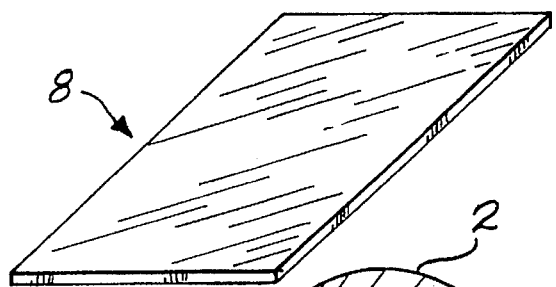
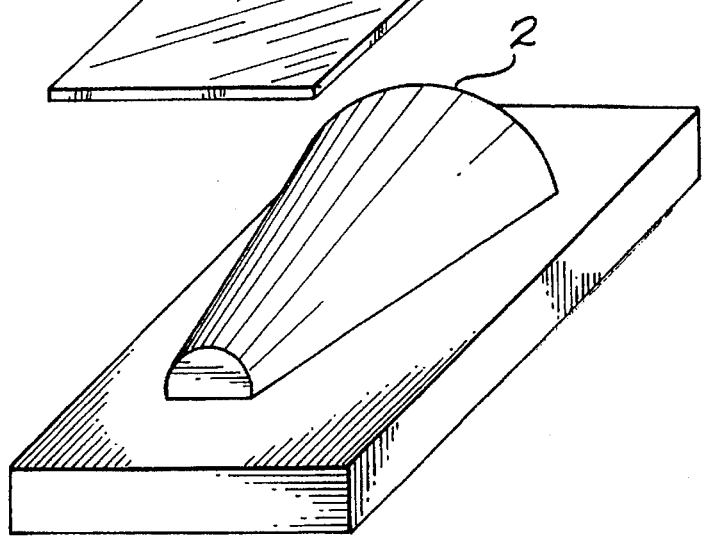
Fig. 4
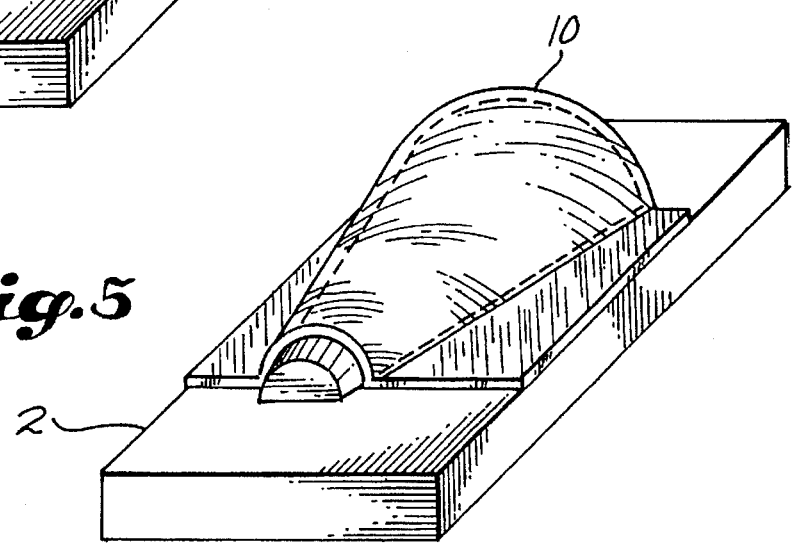
Fig. 5

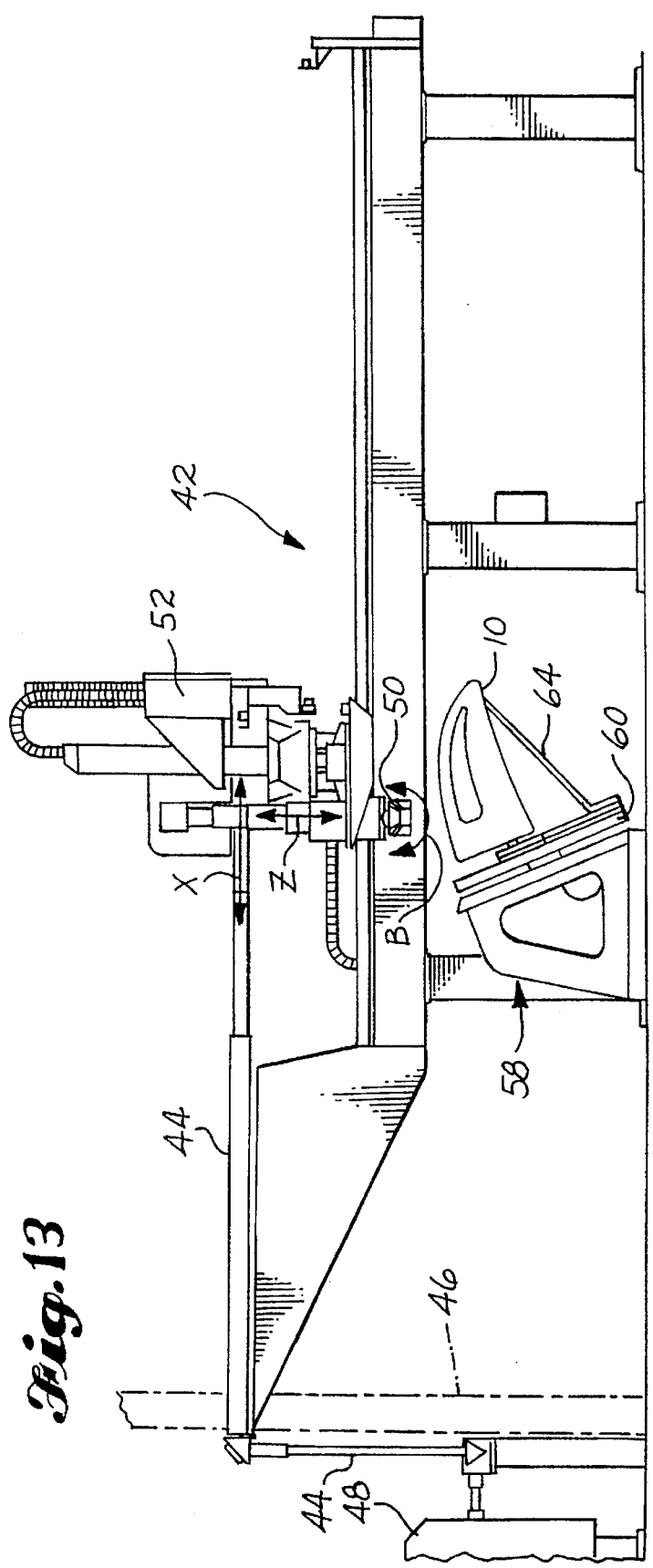

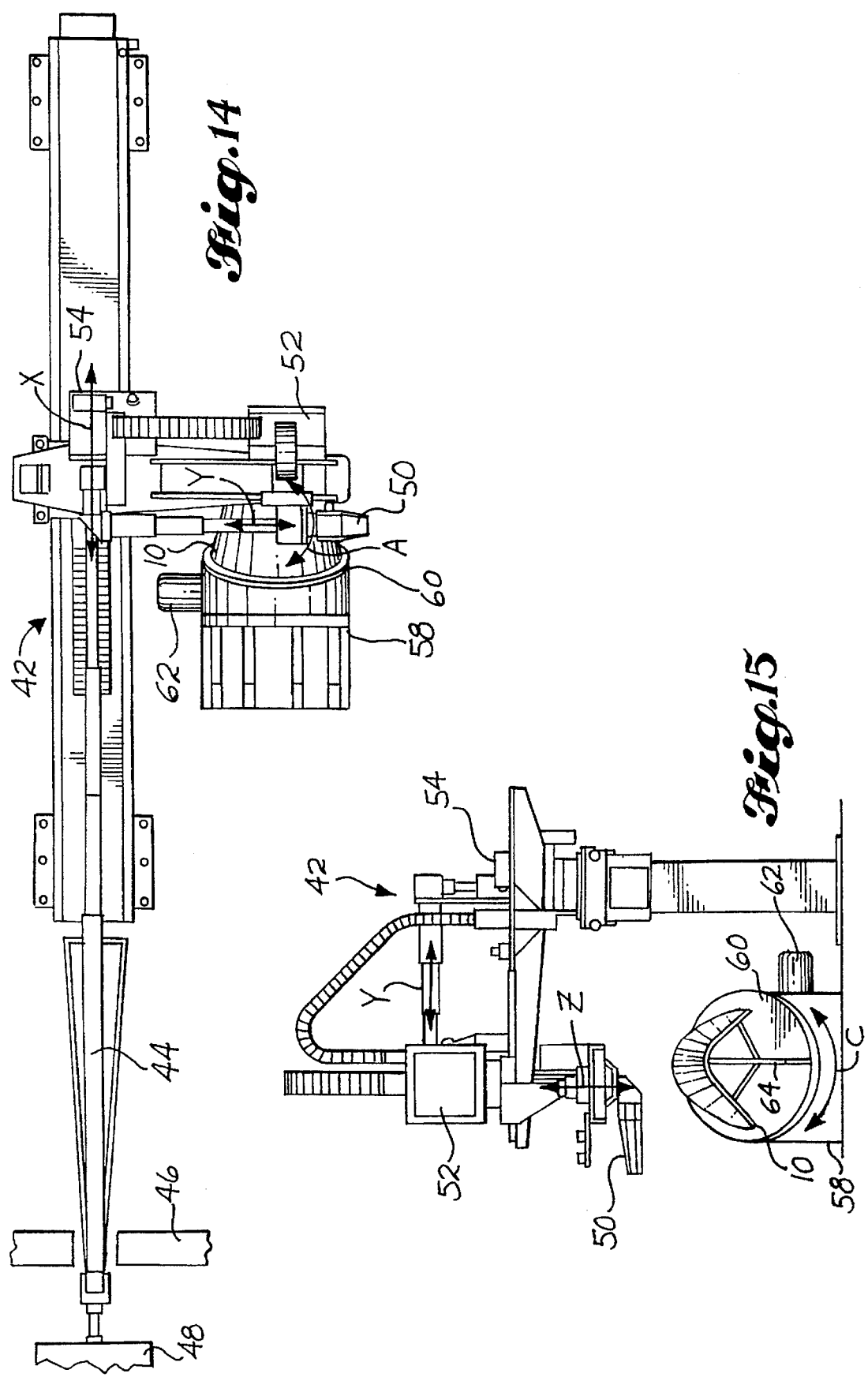

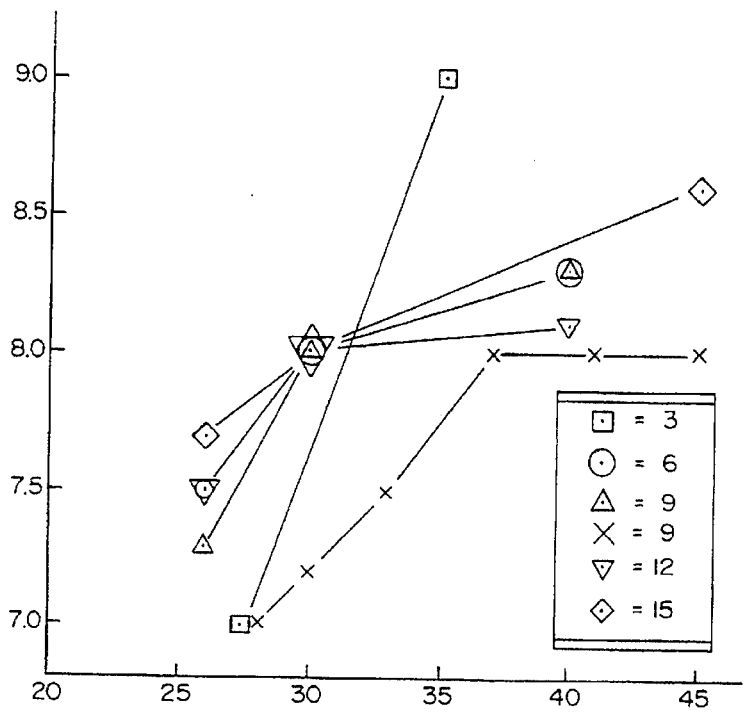
Fig. 18
Fig. 19
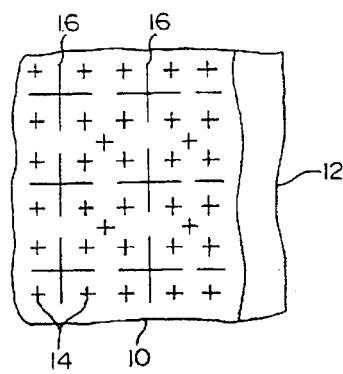
Fig. 20
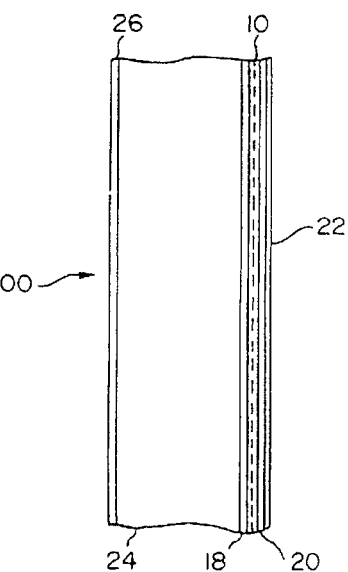

METHOD FOR MAKING PRECISION RADOMES

REFERENCE TO RELATED APPLICATIONS

The present application is a continuation-in-part application based upon U.S. patent application Ser. No. 08/315,993, filed Sep. 30, 1994, now U.S. Pat. No. 5,552,249 which was a divisional application based upon U.S. patent application Ser. No. 07/978,322, filed Nov. 18, 1992, now U.S. Pat. No. 5,395,718.

The present application is also a continuation-in-part application based upon U.S. patent application Ser. No. 08/147,183, filed Nov. 3, 1993, now U.S. Pat. No. 5,468,409.

TECHNICAL FIELD

The invention relates to the manufacture of radomes or other frequency selective surfaces (FSSs) that have patterned curved surfaces and, more particularly, to a method using a conformal mask for forming patterns on curved surfaces using photolithography.

BACKGROUND ART

Frequency selective surfaces are useful in a number of applications, such as radomes, canopies, and other aircraft structures and the receiving surfaces of satellite dishes. A frequency selective surface has one or more patterned metal layers. The accuracy (i.e. bandwidth) of the frequency selectivity of the surface depends on the precision of the pattern formed on the surface insofar as performance is a resonance phenomenon. Complex curvature in the surface makes achieving precise frequency selectivity extremely difficult, especially at a reasonable cost.

Splicing flat sheets of etched copper or flat photomasks onto a multicurved surface produces imprecise alignment and discontinuities (gaps) of the elements of the pattern which produces inaccuracies or differences in performance in the overall pattern, especially from part to part. The inaccuracies broaden the frequency bandwidth of the FSS. Such broadening is unacceptable especially when, from part to part, it is impossible to predict performance because of the variation in the pattern. The bandwidth of the radio signal must be broadened permitting the use of a wider variety of FSSs. It is desirable to have as narrow a bandwidth as possible and to reduce variability and performance from part to part.

Circuit board elements are often etched on flat, plated surfaces in conventional etching processes using photolithographic techniques to define lines to specific tolerances of about ±1.0 rail (i.e., 0.001 in). The initial line width of typically about 2–15 mils is patterned in the photoresist before introducing the etchant, such as a strong acid like ferric chloride. Ferric chloride penetrates quickly through the copper film, and, because of its vigorous etch rate, only modest tolerances are achievable. That is, the etchant begins to etch laterally (i.e., undercut) as it simultaneously continues to etch into the metal. The initial photoresist pattern must define openings in the photoresist narrower than the desired line width in the metal, because undercutting will occur. The etchant will penetrate beneath the photoresist film. The circuit board etching process must be monitored closely so that etching can be halted at the precise time. With a conventional etching process, like those using ferric chloride, it is difficult, if not impossible, to achieve pattern dimensional tolerances of ±0.25 mil (±0.00025 in) even on flat boards, because of the etch rate and inherent process delays, particularly if the part is large. We require a tolerance of ±0.25 mil on large parts having complex curvature to provide surfaces that have narrow bandwidths. Control of overall pattern dimension or absolute line width is more difficult if the film has a complex curvature. With large parts, it becomes more difficult to flush or to neutralize the etchant quickly to stop the etching, and such rinsing is necessary to stop the etching of an aggressive etchant. Using conventional circuit board etching processes, precision is lost, and unacceptable part to part variability results.

SUMMARY OF THE INVENTION

The present invention is directed toward manufacture of precision radomes having frequency selective surfaces made using conformal photolithoghraphy. The process makes it possible to manufacture precision parts efficiently, especially those having multicurved, patterned surfaces with elements etched to close tolerance of about ±0.25 mil. The system of the invention has various aspects, including a method of manufacturing parts, parts made by such method, a mask for use in manufacturing parts, and a method of manufacturing the mask. Use of the mask in the manufacture of the parts is a key feature. It provides consistency in the quality and surface pattern-related characteristics of the parts at a reasonable cost.

The invention provides a method of making parts having a patterned, curved surface, and precisely forming the pattern on the surface so that there is little or no variation from part to part. The method uses a mask having a shape complementary to the curved surface and a pattern that permits photolithography to the desired accuracy of ±0.25 mils on the curved surface. Typically, the mask is a transparent film (e.g., PLEXIGLAS) that is coated or painted to form an opaque layer that i selectively etched to form the desired pattern. The mask pattern defines regions in which light can pass through the mask to underlying photoresist to expose the photoresist while blocking passage of the light in other areas of the pattern. The mask, then, is transparent in its etched areas to where the opaque layer has been removed electromagnetic radiation within a predetermined range of frequencies, such as UV or IR, and opaque to such radiation in other areas where it remains coated.

A thin layer of metal (preferably copper) is applied to the curved dielectric surface of the part body, and a layer of photosensitive material (i.e. photoresist) is applied over the metal. Then the mask and the part body are mated, using a vacuum bag to achieve intimate contact between the mask and the photoresist, and areas of the photoresist are exposed through the mask. The exposed photoresist (which is chemically altered by the incident light used for the exposure) is developed and removed from selected areas. Finally, the layer of metal is precisely etched where the metal is uncovered because of removal of the photoresist.

The step of exposing the layer of photosensitive material preferably uses essentially parallel (i.e. collimated) radiation, for example, laser light or light from a light source relatively far away from the layer transmitted through the transparent portions of the mask close to the layer. A distant light source allows the exposing step to be completed relatively quickly and inexpensively. As used herein, the term "essentially parallel radiation" means radiation that produces a sharp boundary between illuminated area and shadow when it is projected through an aperture. The degree of sharpness required depends on the required tolerances. We are usually seeking to etch the metal layer to about ±0.25 mil (0.00025 inch) with typical pattern element widths of about 3–10 mil (and, preferably, 8 mil), so the mask and associated processing must be at least this precise and accurate.

The mask includes a substrate transparent to the exposing radiation. Transparent and opaque areas are defined by a discontinuous layer of paint or metal on the substrate. The pattern on the discontinuous layer may vary, and as used herein, the term "discontinuous layer" includes isolated patches, or a layer having a continuous background interrupted by slots.

To make a mask, we define a pattern in the opaque coating and remove the coating to leave the discontinuous layer. We generally use laser ablation and define a precise pattern. The mask ensures that, from part to part we achieve reduced variability.

The mask is designed to be a durable and reusable tool for forming a pattern on a plurality of radomes or FSSs.

The mask, like the FSS it produces, includes a multiplicity of substantially identical elements (patches or slots). The elements per se may be either transparent or opaque. The term "substantially identical" means elements with essentially the same shape and the same or different size and the same or different spatial orientation. The sizes of the elements may vary by a factor of two or more. The elements may be touching or separated from each other.

The present invention allows the patterning of multicurved surfaces with repeatable precision to produce FSSs having precise frequency selective characteristics from part to part at a reasonable cost. The mask allows precision patterning so that each patterned part requires relatively little labor and time compared with alternate methods. The invention allows much greater freedom in the design of the structures into which the surfaces are incorporated. For example, surfaces which in the past have had a relatively flattened configuration to accomplish the desired frequency selectivity can now be made with more highly curved configurations to meet other performance requirements while preserving the frequency selectivity.

BRIEF DESCRIPTION OF THE DRAWINGS

FIG. 4 is an exploded, schematic isometric showing apparatus for forming the mask, simplified for the purposes of illustration.

FIG. 5 is another schematic isometric showing the mask on a tool.

FIG. 13 is an elevation of a preferred laser etching apparatus.

FIG. 14 is a plan view of the apparatus of FIG. 13.

FIG. 15 is an end elevation of the apparatus of FIG. 13.

FIG. 18 is a graph showing the line width of etched copper in mils on the ordinate versus immersion time in minutes on the abscissa of the copper in a preferred etchant of the present invention for various exposure times in minutes for the photoresist.

FIG. 19 is a schematic plan view of a portion of the copper film etched in the process of the present invention.

FIG. 20 is a schematic cross-section representation of the copper film of FIG. 19 incorporated into a radome.

BEST MODE FOR CARRYING OUT THE INVENTION make radomes or FSSs to close tolerance with high precision reliably and reproducibility so that each product has the same electromagnetic properties, it is essential to have a precise reusable tool or tool set to permit the fabrication from part to part of the antenna elements to the precise size and shape at the same location on the complex, multicurved surface. In the present invention we achieve the required manufacturing precision by using a mask that allows us to define the antenna elements precisely to an accuracy herebefore unachievable. The mask is a PLEXIGLAS substrate coated precisely with a metal or paint coating. The mask is positionable immediately adjacent to the "green" part (i.e., the part coated with undeveloped photoresist) so that we can use the pattern on the mask to define photolithographically a complementary pattern on the part with increased accuracy and precision because of the proximity of the part and mask.

As those of ordinary skill will understand, the mask corresponds to the masks commonly used in making integrated circuits or multichip modules but is physically much larger because the radome is on the order of feet (with elements on the order of tenths of inches) while the IC is on the order of mils. The mask permits the recreation of a patterned metal through film which, although not necessarily as perfect as desired, is substantially identical from part to part so that the FSSs have predictable electrical performance within a narrow variation from part to part and have substantially identical and interchangeable electrical characteristics.

A typical radome for a modern aircraft is large, being about 6 feet long and 4 feet in diameter, has a narrow bandwidth in which it receives and a second narrow bandwidth (separated from the receive bandwidth) in which it transmits. Elements of different size or different shape on the radome active antenna surfaces determine the respective transmit and receive bandwidths.

The present invention is a method for making the antenna elements in the necessary pattern over the complex multicurved surface for the radome using both a precision mask for accurate photolithography and a precision etching solution for cutting the necessary openings/elements (i.e., the slots or patches), in the electrically active layers of the radome.

Figure 9:
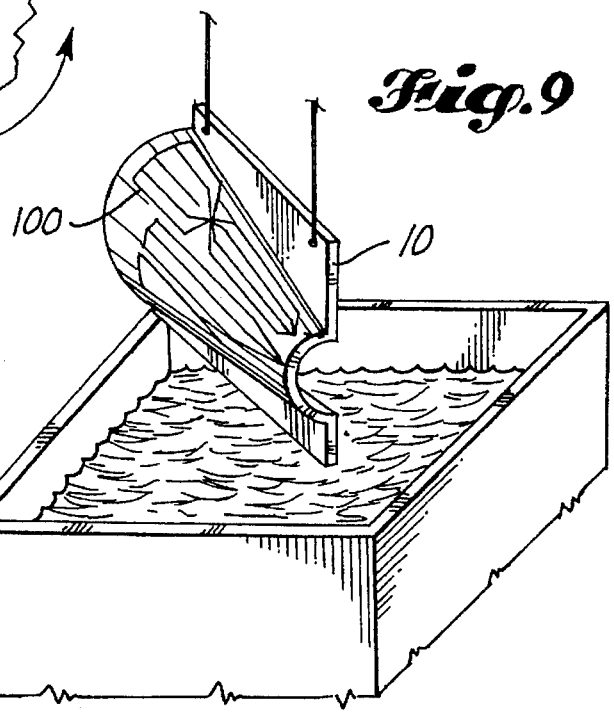
FIG. 9 is a schematic illustrating dipping the mask into a processing bath.
Figure 12:
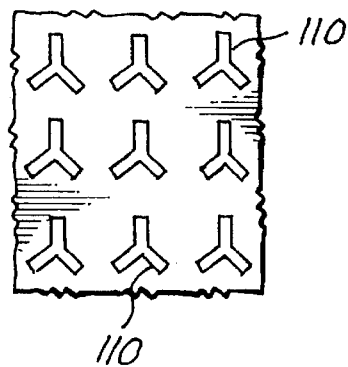
FIG. 12 is a plan view illustrating a typical repeating pattern formed on a part in accordance with the invention.

FIGS. 9 and 12 illustrate two patterns for frequency selective surfaces (FSSs) in accordance with the invention.

The illustrated patterns are a circuit 100 and a pattern of repeating, substantially identical elements 110, respectively. These are only two examples of the many different types of FSS patterns. The invention may also be used to form patterns representing different types of circuits and different repeating elements and also other types of patterns. The shape of the surface on which the pattern is formed and the shape of the mask may also be varied considerably without departing from the spirit and scope of the invention. The surface may be concave or convex and may have simple or complex curvature. FIGS. 4–11 and FIGS. 13–17 illustrate, respectively, two examples of the many possible surface configurations. Typically the FSS will have a regular, repeating pattern of elements of two different sizes so that the surface will transmit and receive in two frequency bands. Those skilled in the art will understand the types of patterns and the sizes, shapes, and arrangements of elements suitable for making FSSs.

A frequency selective surface may be used, for example, in an aircraft canopy or radome. Another possible application of the system of the present invention is in the manufacture of curved circuit boards. Such boards may be advantageous in environments where there is limited space. For example, a generally frustoconical circuit board could be positioned along the inner sidewall of a nose cone of a rocket to minimize its impact on the space available in the rocket.

A. Our Preferred Mask

Figure 10:
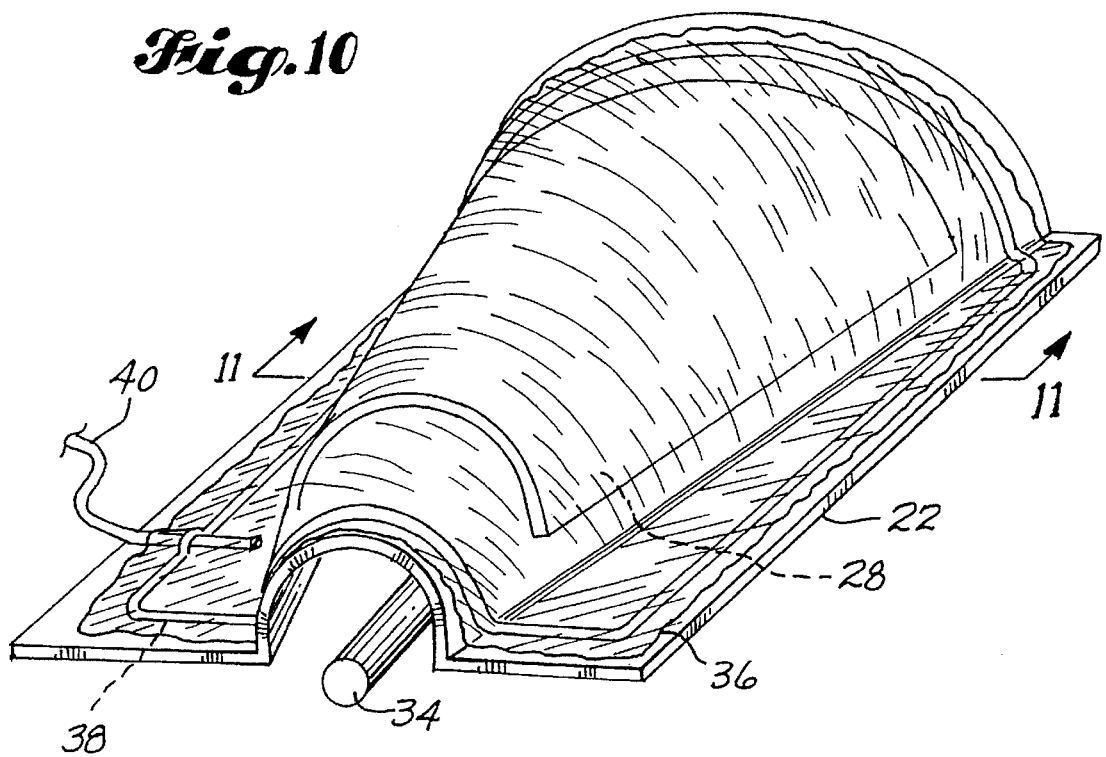
FIG. 10 is a schematic illustrating using the mask to illuminate an FSS.
Figure 11:
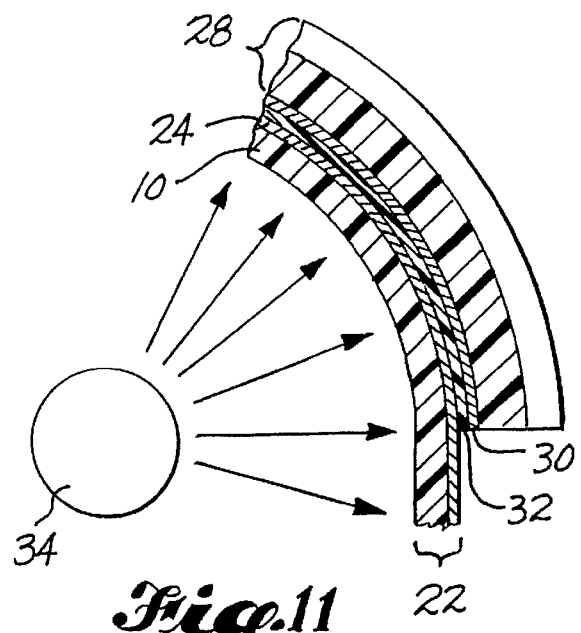
FIG. 11 is a sectional view taken along the line 11—11 in FIG. 10, with the vacuum bagging film omitted.

The mask has a shape complementary to the curved surface of the part so they mate as shown in FIGS. 10 and 11. To accomplish photolithography on the thin film metal coating on the part, the mask substrate must be transparent to the bandwidth of light (i.e., IR or UV) used to expose the photoresist. This is the only bandwidth in which the substrate needs to be transparent and is generally the only bandwidth which we use to illuminate the mask. Of course, a material like polycarbonate (LEXAN) is transparent in the visible spectrum as well. The opaque or absorbing coating on the mask substrate similarly needs only to be opaque in the bandwidth used for the photolithography. It can transmit the incident radiant energy in the bandwidth of interest through the FSS while absorbing or reflecting at frequencies outside that bandwidth.

Opaque portions are defined by depositing a layer or coating on the substrate that has openings to define slots (FIG. 12) or patches. Patches are the opposite of slots and are electrically and physically isolated layers on the mask substrate like islands in the ocean. Typically we coat the entire surface and selectively etch away portions to create slots in the desired pattern.

The opaque material usually is either metal (CVD copper) or paint (such as gray alkyd enamel paint).

Figure 1:
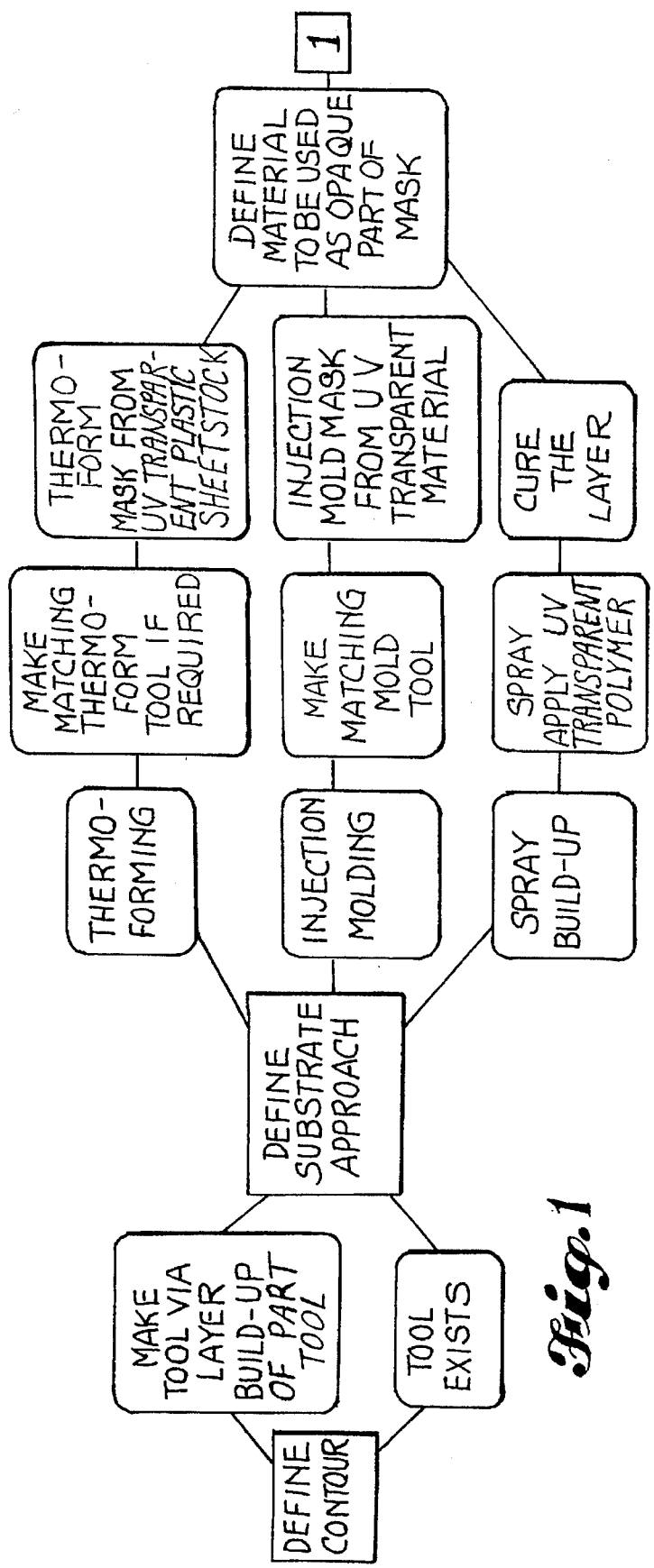
FIGS. 1 and 2 together outline the preferred steps for making the mask of the present invention.
Figure 2:
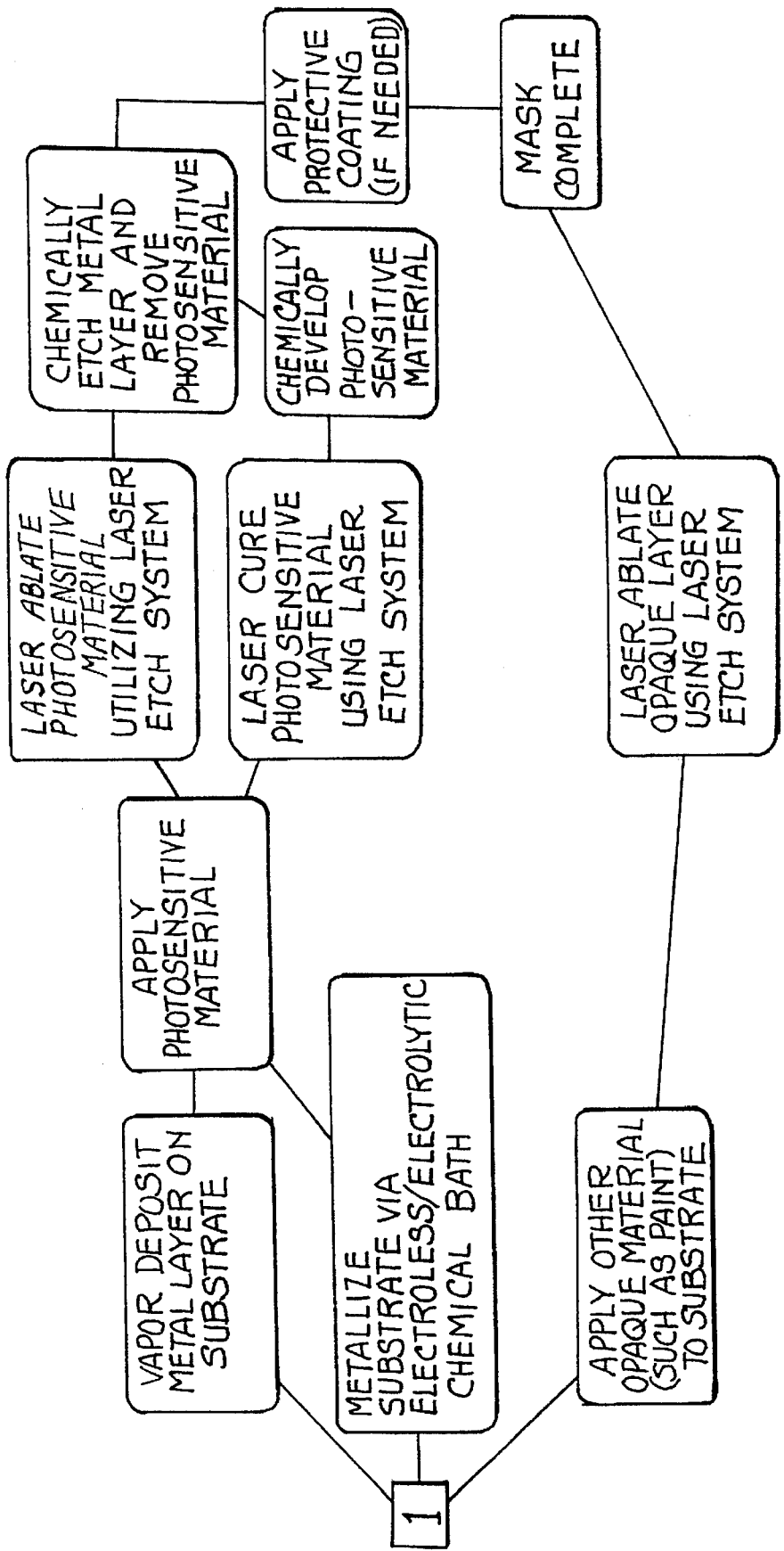

The method of making the mask is schematically outlined in FIGS. 1 and 2. FIG. 1 illustrates the manufacture of the mask substrate. The first step is to define the contour of the mask based on the contour of the FSS. The mask contour is complementary to the curved part surface to allow intimate contact between the mask and the part during the patterning. We "form" the mask substrate by machining, spray and layer build-up, various molding procedures (such as injection molding and thermoforming), and other procedures for creating the desired contour, generally using a tool on or against which the substrate is formed. Injection molding also requires a matching tool. The tool that defines the mask surface that will mate with the parts being manufactured is preferably made by building up a tool for the manufacture of the radome or FSS itself so that imperfections in the part are matched in the mask.

We generally thermoform the mask substrate as illustrated in FIGS. 4 and 5 using the built up tool 2 and a matching tool 4 with a cavity 6. The thermoforming is accomplished by release coating the tool parts 2, 4 and bringing the two tool parts 2, 4 together to form the mask substrate 10, which is usually a thermally softened plastic sheet stock 8, such as polymethyl methacrylate, which is sold under the trademark "PLEXIGLAS" and which is currently the preferred material, polycarbonate, which is a plastic sold under the trademark "LEXAN," or PETG (Polyethylene Terephthlate Glycol). The factors governing the choice of the material include thermoformability, degree of transparency, dimensional stability, and ability to achieve adhesion to the subsequently applied opaque layer.

The mask substrate can be made using injection molding with matching tools and a resin transparent to ultraviolet (UV) light, like PETG. Molding is preferred when the curved surface would introduce excessive plastic stretch in a thermoforming procedure.

Another method for making the mask substrate is spray build-up. In this procedure, the organic resin is sprayed onto the built-up tool. Following the spray application, the resin is cured.

The first step for creating the opaque portions on the mask substrate is to apply a uniform thickness of an opaque material (one that absorbs or reflects the frequencies to which the mask substrate is transparent) in a desired pattern.

Figure 7:
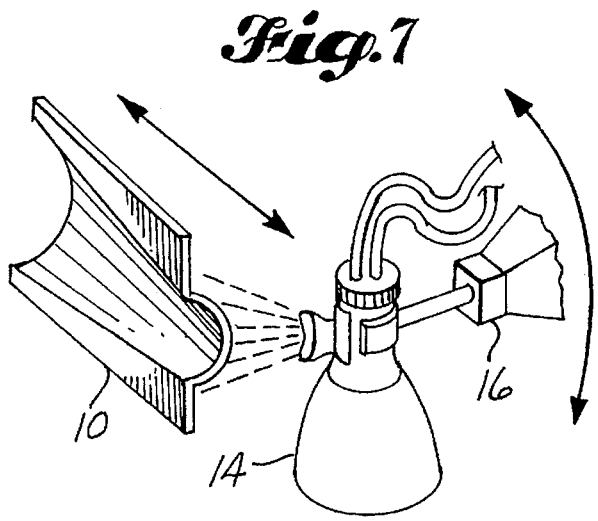
FIG. 7 is a schematic illustrating spraying a photosensitive layer over the metal layer formed in FIG. 6.
Figure 8:
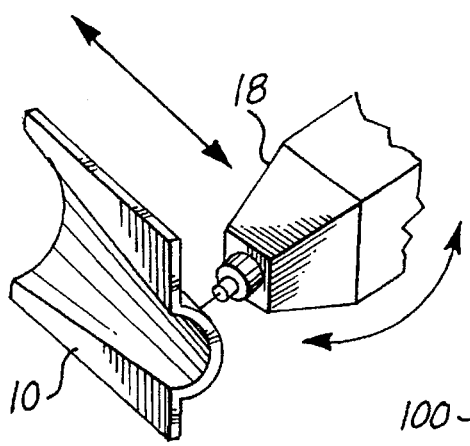
FIG. 8 is a schematic illustrating laser etching of the mask and/or its coating layers.

For a metal coating, after depositing the metal over the entire surface we use photolithography to pattern it. A laser selectively cures portions of a photoresist overcoat which are developed to expose the metal in selected locations. We etch the metal chemically. Alternatively, we might simply ablate the photoresist rather than using a two-step "cure and develop" process. We prefer paint for the opaque material because it is more durable than metal and is easier to use. The paint may be sprayed with a sprayer 14 manipulated by a robot 16. (FIG. 7) Once the paint has dried, areas of the paint layer are defined, and portions of the paint are removed with laser ablation. FIG. 8 illustrates a high power ultraviolet laser head 18 moving over the mask substrate under robotic control to ablate the paint in the temporary areas. Following the laser ablation, the mask is complete.

Photolithography might also be used to define a pattern so that the opaque material can be accurately and precisely deposited on the mask substrate on the desired locations rather than being etched after covering the entire surface.

Figure 6:
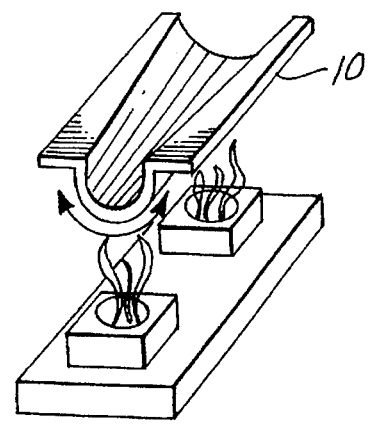
FIG. 6 is a schematic illustrating vapor deposition of a metal layer on the mask substrate of FIG. 5.

A metal layer may be vapor deposited on the substrate 10 using, for example, E-beam evaporation, as illustrated in FIG. 6. Alternatives for applying the metal layer is electroless/electrolytic plating or sputtering. After the metal layer has been applied, a uniform layer of photosensitive material is applied over the metal layer. This second layer may be applied in various ways but is preferably spray-applied, as illustrated in FIG. 7. Other application techniques that may be suitable are spin and dip coating. The suitability of these techniques depends on their capability to produce an even coating, which in turn depends primarily on the size and geometry of the substrate. As used herein, the term "photosensitive" means that the material is sensitive chemically, electrically, or otherwise to the action of radiant energy in the incident range of frequencies.

After the layer of photosensitive material has been applied, portions of this layer are exposed to electromagnetic radiation to define temporary and permanent areas of the opaque layer. To accomplish sharp definition between the opaque and transparent portions of the completed mask, the radiation is preferably essentially parallel, and even more preferably is radiation from a laser, as FIG. 8 illustrates. The laser may be used either to cure or ablate portions of the photosensitive layer. In the case of laser curing, the laser is used to render the temporary areas soluble in a chemical development solution or to render the permanent areas insoluble. If the photosensitive material is a negative photoresist, i.e. exposure to the laser makes it become insoluble, the permanent areas are exposed to the laser. In the case of a photosensitive material that is a positive photoresist, the temporary areas are exposed to the laser to render them soluble.

Following the laser curing, the coated substrate is chemically etched to remove the soluble temporary areas of the photosensitive material. Then, the metal exposed by removing the temporary areas of photoresist is etched while leaving the metal in the permanent areas to define the opaque portions of the mask. After the metal has been etched, the remainder of the photosensitive material is removed. Optimally, we apply a protective coating over the now discontinuous metal layer.

FIG. 9 illustrates the mask being lowered into a processing bath 20, which may contain a development chemical, an etching chemical, or a chemical for removing the remaining photosensitive material. The mask could be subjected to each of these types of chemicals by means other than a bath. For example, the chemical could be sprayed onto the mask.

Instead of laser curing, we can use laser ablation (i.e., etching) to define and remove the temporary areas of the photosensitive material and the paint or metal, if desired.

We sometimes need to adjust the pattern to compensate for the curvature. For example, in the case of a pattern of repeating elements, such as the pattern illustrated in FIG. 12, the curvature frequently distorts the pattern so that its electrical performance would be altered. To prevent such distortion from adversely affecting the performance of parts, we can rotate the elements of the pattern or vary their size to compensate for the curvature. Those skilled in the art will understand the effects of the curvature and how to deal with them in designing a suitable pattern for the mask and the complementary radome or FSS.

Temporary and permanent areas of the opaque layer can be exposed using a light source that is relatively far away from the mask surface through an aperture close to the surface to provide essentially parallel radiation on the opaque layer rather than using a laser. Light radiation projected in this manner is essentially parallel, within the contemplation of the invention, if the edge of the aperture defines a sharp shadow. The use of a distant light source has the potential advantage of making areas of the mask surface that a laser head cannot reach because of the contour accessible to the radiation. However, a laser is generally preferred because it produces a greater degree of sharpness in the definition of the opaque portions of the mask and a resulting greater accuracy in the patterning of parts subsequently made using the mask. The accuracy of the mask is preferably maximized by using a precision laser etch system, such as the five-axis gantry 42 shown in FIGS. 13–16.

Another variation of the making of the mask that is not shown in FIG. 2 is the direct laser ablation of the metal layer simultaneously to define and to remove the temporary areas of the metal layer. This procedure dispenses with the need for the application and removal of a photosensitive material over the metal layer. However, the procedure also has some drawbacks. The metal layer is preferably very thin so that its etching will result in distinct and clean edges defining the boundaries of the elements. We seek a maximum metal thickness of about 3000 Angstroms, but a metal coating this thin is easily damaged. Therefore, a protective coating is necessary in the finished mask. The protective coating can affect the sharpness of the edges in the subsequently manufactured parts. In contrast, a 0.5 mil thick layer of paint can be laser ablated with resulting sharp, very well defined edges. Since paint is more durable than a very thin metal layer, no subsequent protective coating is needed (although one may be used). Omitting the protective coating helps achieve a greater precision in the manufacture of the parts. In addition, the procedures using paint are relatively simple and inexpensive to carry out. The paint can be sprayed onto the substrate, while the metal must be deposited by means of more complicated and expensive procedures, such as vapor deposition and electroless/electrolytic plating.

The order of the steps may also be varied. For example, the opaque layer could be applied to the substrate before the substrate is formed. The acceptability of such variation in a particular circumstance depends largely on the degree of curvature of the formed surface and the allowed tolerances of the completed FSS or radome.

It is possible to spray the opaque layer and the structural substrate as a stack-up on the tool, but, doing so, is more difficult than the "substrate forming and subsequent layer applying" procedure. Spray buildup has the advantage of having fewer inherent limitations, such as the limitations that are inherent in molding procedures.

In the stack-up procedure, a release agent is applied to the tool surface on which the mask is to be built up. A thin layer of metal or paint is applied uniformly over the release coated tool surface. If the opaque layer is to be laser ablated, the next step in the manufacture of the mask could be to laser ablate the temporary portions of the opaque layer. Following the ablation, a uniform layer of structural material is applied over the laser ablated discontinuous opaque layer. The structural material forms the substrate of the mask and is transparent to the predetermined frequency range. The selection of the substrate material is made on the basis of a number of factors, including degree of transparency, ease of application, ability to adhere to the remaining opaque material, and tendency to release from the exposed release treated built-up tool surface. After the structural material has been applied and formed over the tool, the structural material and discontinuous opaque layer are removed as a unit from the tool. The mask is then complete except for a final protective coating, if one is required.

If the opaque layer is not ablated directly, the step following the application of the opaque layer over the tool surface is the application of a uniform thickness of photosensitive material over the metallic layer. This layer may be spray, spin, or dip coated. The choice of the particular application technique depends, at least in part, on the nature of the material being applied and the degree of contour of the tool surface. The photosensitive material is patterned and the opaque layer is etched.

B. Using the Mask to Define the Elements on the Part

Figure 3:
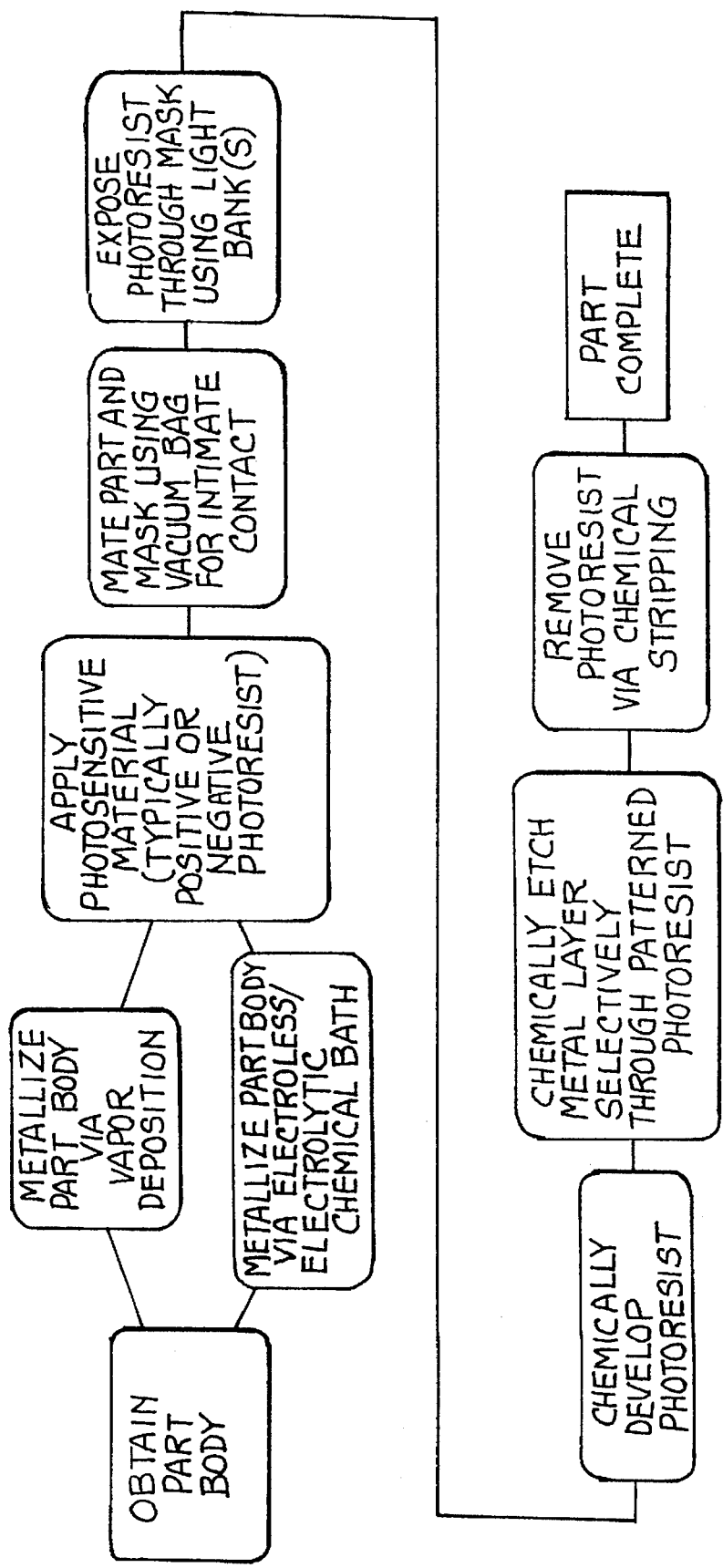
FIG. 3 is a schematic illustrating the method of making parts using a mask.

Referring to FIG. 3, making of the part involves forming a part body having the desired contour, which typically is a complex curve. The part body typically is a fiber-reinforced organic matrix composite that is dielectric so that we achieve the desired electrical properties for the radome/FSS, as those skilled in the art will understand. A continuous, overlying layer of metal is uniformly applied to the curved surface of the part body by vapor deposition (e.g. copper) or electroless/electrolytic plating. Patterning the metal precisely again involves photolithography. FIG. 11 illustrates the part body 28 and its metal 30 and photosensitive layers 32, which we will refer to as an intermediate.

This intermediate is mated with the corresponding curved mask surface, as illustrated in FIGS. 10 and 11. A vacuum bag suction, illustrated as the transparent vacuum bagging film 36 and vacuum line 40 in FIG. 10, is used to achieve intimate contact between the mask 22 and the photosensitive material 32 to ensure a sharp image on the part surface. Light in the proper frequency bandwidth passes through the unpatterned areas of the mask 22 those transparent areas that lack an opaque overcoat while the mask 22 and part 28 are intimately mated. As shown in FIG. 10, when the bag 36 and the radiation source 34 are on opposite sides of the mated part body 28 and mask 22, the bag 36 need not be transparent. When the bag and radiation source are on the same side, i.e. the radiation must go through the bag to reach the mask, the bag must be transparent to the predetermined range of frequencies.

The photosensitive material 32 is typically either a positive or negative photoresist. If the material 32 is a positive photoresist, the areas of the layer 32 corresponding to the portions of the metal layer 30 that are to be etched are exposed to the radiation. In the case of a negative photoresist, the areas which are not to be etched are exposed. Following the exposure of the photosensitive layer 32 through the mask 22 to define the desired pattern in the photoresist, we remove the mask 22, and remove the soluble portions of the layer 32 to expose portions of the metal 30. We chemically etch through the exposed metal leaving the remaining patterned photoresist 32 in place and then remove the remaining photoresist 32 by chemical stripping to complete the part. The details of this etching process follow.

C. Etching the Mask or Part

The chemical etch requires high precision and close tolerance to achieve the proper electrical properties in the radome and to achieve part-to-part uniformity. We prefer to use a weak etchant in a process that gives us the processing control required to obtain the desired precision and accuracy.

Controlling undercut in metal etching using photolithographic techniques is essential to achieve reproducibly and reliably close tolerances as small as ±0.00025 in (0.25 mil) on thin film copper, especially for elements having complex curvature. By using a mild copper etchant having a slow and well-defined etch rate, such as one containing dilute $CuCl_2$ and concentrated NaCl in deionized water, we can achieve a precision etch on large vapor deposited copper parts with pattern dimensions controllably cut to the desired tolerance of ±0.25 mil using otherwise standard dip tank chemical etching equipment. Our preferred etchant comprises about 5 gm $CuCl_2$ and 150 gm NaCl per liter of deionized water. Our tests with this preferred saline etchant on vapor deposited copper using about 0.5 $ft^3$ etchant/$ft^2$ Cu show that the etch rate declines significantly (to less than 0.01 mil/min). With this etchant, then, we can immerse a large, multicurved part and can etch it precisely to close tolerance over relatively long immersion times because the etch rate decline is so dramatic that continued exposure to etchant has almost no effect. With this etchant, we have minimized the effects otherwise caused by relative orientation, solution depth, temperature distribution, natural convection, migration or electrolytic effects, and the like in producing etched copper circuit elements with tolerances of ±0.25 mil for vapor deposited copper on multicurved, plastic circuit board substrates.

In the method, we generally use conventional photolithography to selectively protect (i.e., mask) the copper and to expose element dimensions approximately 1 mil narrower than the desired final dimension. Typically, the copper is vapor deposited to a nominal thickness of about 0.1 mil. We use 0.5 $ft^3$ etchant/$ft^2$ Cu. The etchant has a composition of about 5 gm $CuCl_2$ and at least about 150 gm NaCl per liter deionized water (purity>1 megaohm-cm). The etchant is heated to about 140° F.±3° F. when the board is immersed in a quiescent, stagnant tank. The part remains immersed for about 25–45 minutes, and, preferably, 25–30 minutes before it is checked for completion. The part is monitored after checking until the desired dimensions are achieved. During immersion, there is no agitation. We have achieved repeatable, reliable etching to precise tolerances of about ±0.25 mil on all dimensions.

The etchant is a mild acid so that its etch rate will be relatively slow. We typically use this process for etching large parts of high value to close tolerances where pattern dimensions are important to control to achieve the desired functional performance. In this case, the cost of etching is insignificant relative to the part value. Therefore, we prefer a slow etch rate that helps us to achieve the close tolerances we need. We have found that the etch rate for this preferred solution declines to a very low rate at the point where our etch is essentially complete. Thereafter, we do not need to race or hurry to neutralize the etchant or to flush the part. Other conventional copper etchants like ferric chloride did not provide us with the control we need.

FIG. 19 shows a typical copper film 1000 of nominal thickness of about 0.1 mil vapor deposited on a suitable circuit board substrate 1200 and etched with the process of the present invention. Fine-line patterns (here, crosses) 1400 are cut in the film 1000 to line widths of between about 3–10±0.25 mil. Elements 1600 are larger, showing that not all the elements in the desired pattern need to be the same size. The close tolerances are reproducibly and reliably achieved with proper masking and monitored immersion in the dip tank. Different sized slots, of course, generally respond to different frequencies in the transmit or receive mode of operation.

The concentrated saline solution functions to minimize or eliminate any migration or electrolytic effects that otherwise might upset control of the etch. While we use at least about 150 gm/l NaCl, other common salts or mixtures of salts and other concentrations can be used, as those skilled in the art will recognize. We suggest a minimum concentration of about 125 gm/l. This concentration ensures that the solution will not undergo significant electrolytic changes during the etching process.

The solution is a dilute acid, typically containing only about 5 gm/l $CuCl_2$. We discovered that the etch rate is so low in this case (at least near completion of the etch) that using a heated solution is desirable to accelerate the etch rate at the outset. We suggest immersing the part in a conventional dip tank for chemical etching filled with the preferred $CuCl_2$ saline solution heated to about 140°±3° F. We have not thoroughly investigated the relationship between the etchant temperature and the etch rate, but speculate that other temperatures could be used without losing control of the ultimate pattern dimensions. A lower temperature is preferred to reduce natural convection effects that might disrupt the fine control we need. Convection could make it difficult to obtain control to the ±0.25 mil tolerance over the entire surface of the large, curved parts for which this process is designed and the functionality we need could be lost.

We endeavor to make the process diffusion driven and have attempted to minimize the contribution of migration or convection.

While 5 gm/l $CuCl_2$ is preferred, we could use other concentrations of the acid undoubtedly without loss of dimension control. We, however, have not investigated to any great degree the relationship between acid concentration and etch rate. We have discovered that using about 5 gm/l $CuCl_2$ in concentrated saline provides an etch rate after about 25–30 minutes immersion of our part slow enough that there is no criticality in quickly removing the part from the tank, neutralizing the acid, or flushing the part. This feature is particularly beneficial when working with fine details on large parts of complex curvature where flushing and neutralizing cannot occur simultaneously everywhere on the part.

The pH of our preferred solution is about 3.6. After etching, the solution has a pH of about 3.8.

FIG. 18 shows our test results on sample parts overcoated with photoresist exposed for differing lengths of time. This data suggests that the photoresist exposure be in the range of about 6–12 minutes, but we have run only a small number of tests. In each case illustrated in FIG. 18, the test specimen included a photomask of nominal line width of about 7 mils with a target final etched line width of 8.0±0.25 mils on the 0.1 mil thick vapor deposited copper.

The mask is designed so that the exposed initial line width is about 1.0 mil less than the final desired line width (for 0.1 thick copper). For thicker copper films, the initial line width might vary, but we have not done sufficient testing to discover the relationship between initial line width and film thickness to achieve final line widths of ±0.25 mil tolerance. Our films of interest are 0.1 mil thick vapor deposited copper of complex curvature. FIG. 18 shows the slow etch (or the etch rate decline) when line widths of the desired nominal width (here 8.0 mils) are met. This etch rate decline helps us finish the widths to the close tolerances we require across the part.

FIG. 20 schematically illustrates use of the etched copper film 1000 in a radome 10000. The film 1000 may be secured between two dielectric sheets 1800 and 2000 near one face of the radome 10000. Dielectric sheet 2000 in turn, is adhered to a toughened resin composite skin 2200. On the other face the dielectric sheet 1800 is adhered to a honeycomb core 2400 that, in turn, has a toughened resin composite skin 2600 on its outer exposed face. If desired, several layers of copper film 1000 in capacitive or inductive configurations or both separated by dielectric layers may be used. Of course, those skilled in the art will recognize other practical radome constructions where the etched copper film 1000 can be used.

Figure 21:
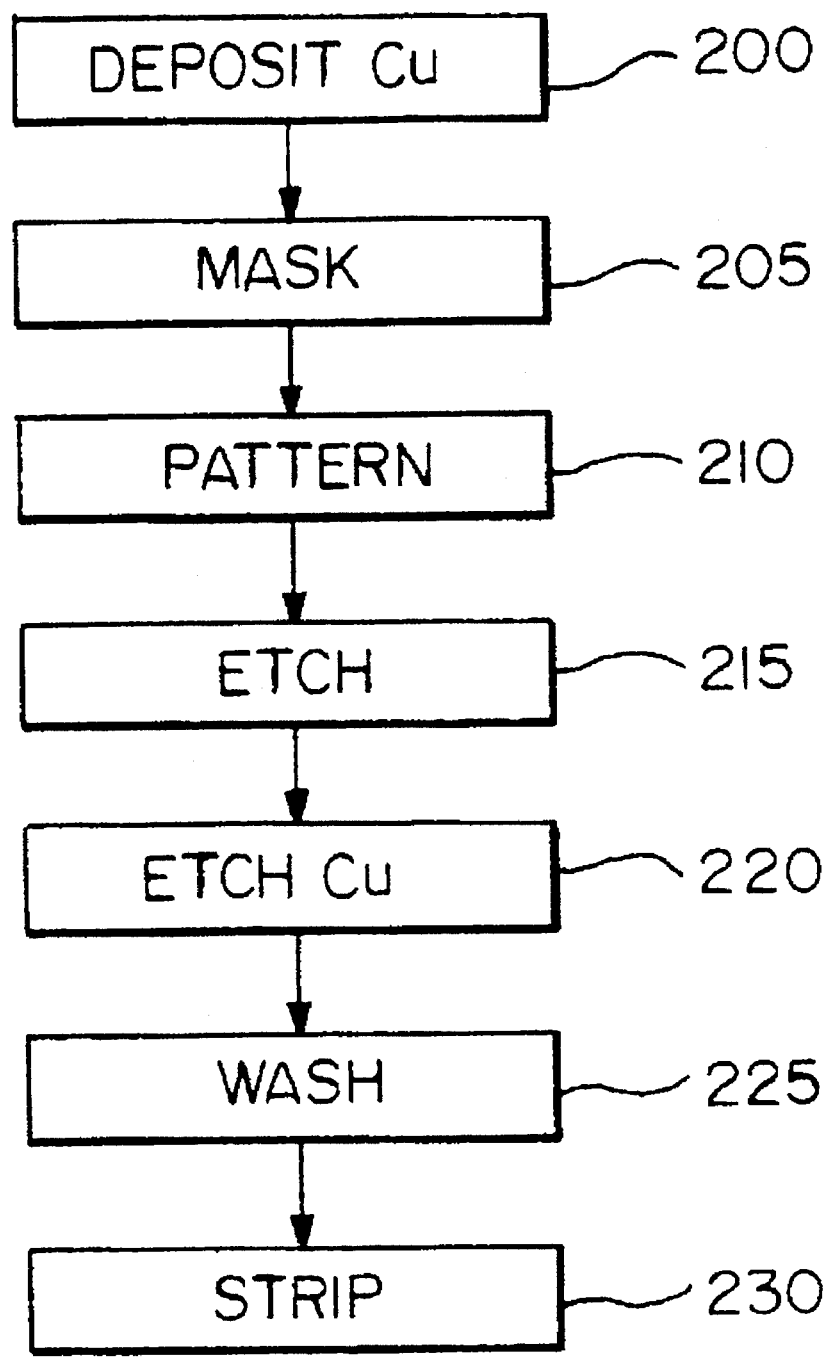
FIG. 21 is a block diagram of a preferred etching process.

FIG. 21 shows the overall process in block form. In the first operation 200, copper film 1000 is vacuum deposited on a suitable substrate 1200. Then, the film 1000 is covered with a suitable photoresist (step 205), followed by selective exposure of the photoresist to identify the intended elements (step 210). The patterning typically involves exposing selected portions of the photoresist to ultraviolet (UV) radiation through a mask which alters the exposed photoresist and which permits its selective removal or developing in step 215 to yield openings to the copper through the photoresist in the desired pattern. Next, the part is immersed in the copper etchant dip tank (step 220) to form the elements in the unprotected areas of the copper film. After the etch is complete, the film is rinsed in step 225 and the photoresist is then stripped (typically by exposing it to UV with subsequent developing) from the part (step 230) to leave the patterned copper on the protective substrate.

D. Overall Process Considerations

In the manufacture of the mask and the parts, a number of factors contribute to the accuracy of the patterning on the parts. These factors include the intimate contact between the mask and the part, the surface uniformity of the coatings and the mask substrate, the absolute thickness of the coatings, and the orientation of the laser with respect to the surface being processed.

As shown in FIGS. 10 and 11, the photosensitive layer 32 is exposed by means of a light source 34, like a mercury vapor lamp preferably the light source 34 delivers essentially collimated light in the desired bandwidth to maximize the sharpness of the patterning on the completed part.

Sometimes the configuration of the part is such that it is impossible to use a unitary mask to pattern the entire surface. In such case, the surface may be patterned using two or more segments that mate together to form the mask. A major drawback, however, of using mask segments is that the segment junctions must be positioned so that the inherent inaccuracies such junctions create in the patterning do not result in unacceptable degradation of the desired performance characteristics of critical locations of the parts. Overlapping portions of the segments and alignment of features, of course, eliminates interruptions in the patterning along junctions, but proper alignment remains difficult for the large, bulky, and awkward segments, especially to the accuracies we require.

The laser etching uses a precise laser etch system as shown in FIGS. 13–16. The system includes a five-axis laser gantry 42 for positioning an end effector 50 that carries the laser projection optics. When positioned correctly, the optics project the laser beam substantially normal to the target point on the surface. The five-axes of the gantry 42 include the X, Y, and Z transitional axes and the rotational axes A, B illustrated in FIGS. 13–15. In the system, a laser beam is transmitted from a laser source 48 via a beam tube 44 that extends through a wall 46 to the end effector 50 and includes mirrors to direct the laser beam. fiber optics could also be used in place of the beam tube 44. The positioning of the end effector 50 relative to the mask substrate 10 is accomplished by means of movement along and about the five axes. An interferometer 54 provides laser interferometer feedback to control translational positioning along the X, Y, and Z axes to a high degree of accuracy. The accuracy of positioning on the gantry rotational axes may be verified by use of positioning encoders. a vision inspection system 52 is also provided. This system 52 is used primarily to verify that an element of the pattern has been correctly treated before the end effector 50 and/or the substrate 10 are moved for defining further elements of the pattern.

Figure 16:
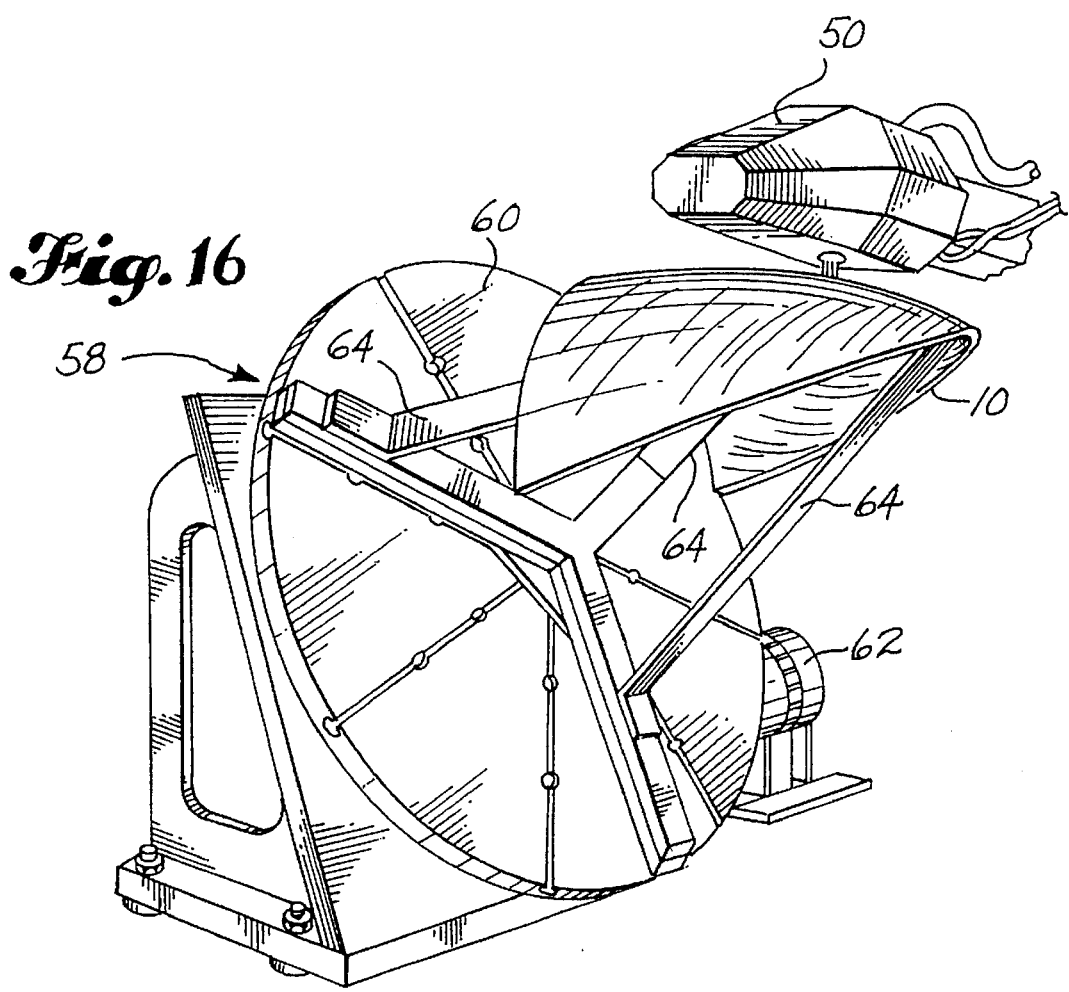
FIG. 16 is a pictorial view of the mask support fixture shown in FIGS. 13–15 and other laser etch apparatus.
Figure 17:
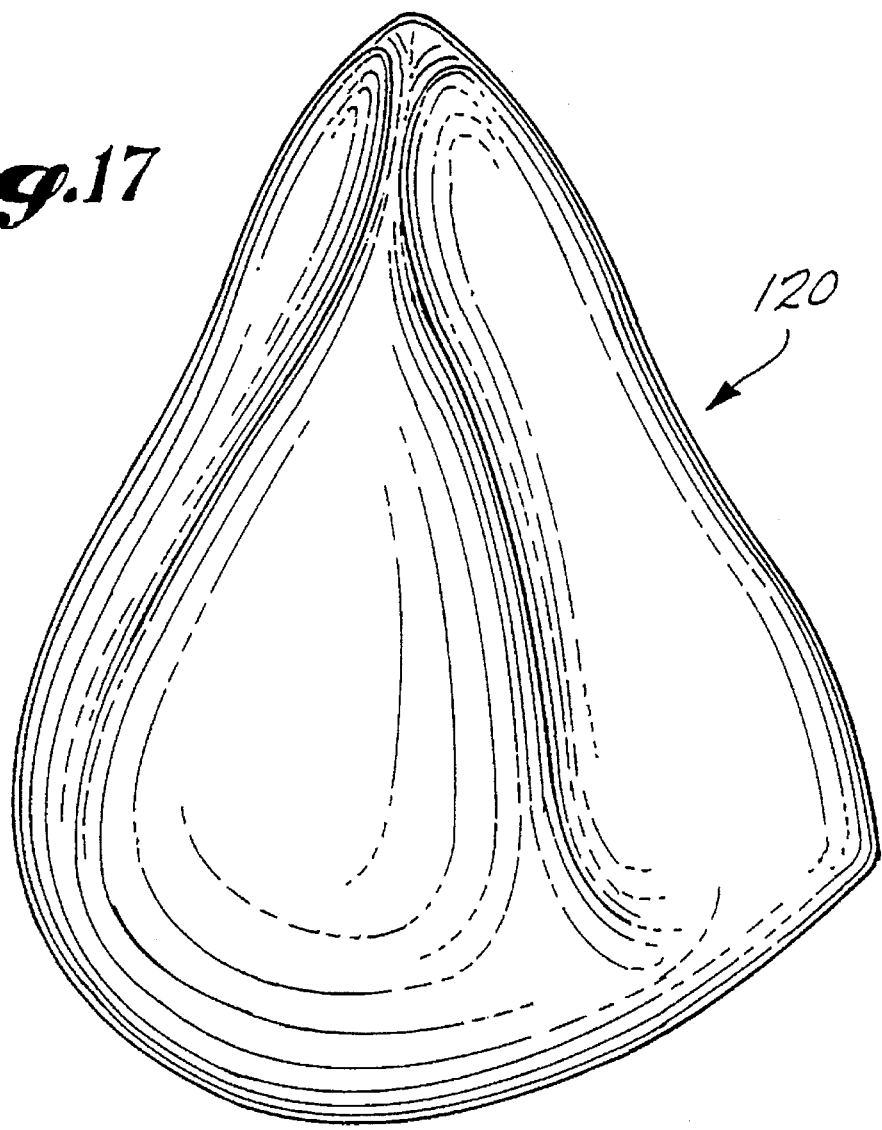
FIG. 17 is a schematic isometric of a typical radome surface prior to patterning.

The end effector 50 includes laser focusing lenses and an aperture. The aperture is the shape of the elements to be etched on the mask surface. For example, with reference to the pattern shown in FIG. 12, the aperture would have the shape of one or a plurality of the individual elements 110. The aperture is carried by an aperture holder that is movable along two translational axes and about a rotational axis to provide precise micro-positioning of the aperture and the resulting laser beam. The translational and rotational axes are orthogonal. The rotational axis is collinear with the laser beam to permit the pattern elements to be rotated compensating for curvature, as described above. The end effector 50 further includes a laser diode height gauge system to ensure the proper focal distance. Out of tolerance focal distance is automatically corrected by manipulation of pertinent robot axes. The end effector 50 preferably also includes a light operated (LED) proximity sensor to automatically trigger shut-down of the laser and robot if the end effector 50 is too close to the substrate 10. FIGS. 13 and 15 show the end effector 50 in a raised nonuse position. FIG. 16 illustrates the use position in which the end effector 50 is typically about two inches above the surface being etched.

The laser etch system also includes a workpiece support fixture 58 for supporting the mask substrate 10 being patterned, as best seen in FIG. 16. The fixture 58 includes a turntable 60 on which the substrate 10 is mounted by means of support struts 64. The fixture 58 adds an additional axis to the overall system for relative positioning of the mask substrate 10 and the end effector 50. This is the rotational axis C of the turntable 60 indicated in FIG. 15. An actuator 62 provides the rotation of the turntable which is preferably verified by a suitable position sensor, such as a laser encoder.

The laser itself preferably emits in the ultraviolet and provides sufficient sharpness of the boundaries of the etched areas without damaging the mask substrate. Different lasers may require changes in the materials used in manufacturing the mask and the parts. For example, a short pulsed $CO_2$ laser may be suitable in some applications, but would require a mask substrate transparent to infrared radiation as well as ultraviolet radiation unless an infrared-sensitive photoresist exists.

For laser etch precision, controls constantly adjust the end effector 50 in response to feedback from monitoring devices regarding actual operating conditions. The gantry 42 and support fixture 58 are mounted on a vibration free foundation and are located in a carefully controlled environment. Temperature, humidity, and barometric pressure are continually monitored. Compensation feedback regarding these parameters is fed to the control system, which automatically adjusts to variations. The entire system shown in FIGS. 13–16 is calibrated with a look-up table. The table takes into account a number of imperfections in the system, such as imperfections in the gantry supports.

Those skilled in the art will recognize that the invention may be used to advantage in a variety of situations. Therefore, it is also to be understood by those skilled in the art that various modifications and omissions in form and detail may be made without departing from the spirit and scope of the invention as defined by the following claims.

We claim:

1. A method for making precision radomes having electrical transmitting and receiving bands within at least one narrow predetermined frequency range because of at least one accurately made frequency selective surface in the radome, comprising the steps of:
   a) coating a copper film with photoresist;
   b) exposing predetermine potions in the photoresist using a conformal mask seated adjacent the copper film to block exposing radiation: from reaching selected portions of the photoresist;
   c) removing the exposed or unexposed photoresist to expose portions of the copper in a pattern to provide a frequency response of the radome within the frequency range;
   d) etching the copper to define elements to accuracies of ±0.25 mil using an aqueous copper chloride/chloride salt etchant;
   e) removing the remaining photoresist to yield a patterned copper film responsive to the frequency range; and
   f) reusing the mask.

2. The method of claim 1 wherein the film has complex curvature in the patterned portion.

3. The method of claim 1 wherein the copper chloride/chloride salt etchant comprises:
   a) an effective amount of cupric chloride in initially deionized water to form an acid capable of etching the copper; and
   b) at least about 125 gm/l chloride salt to negate migration effects.

4. The method of claim 1 wherein etching a copper film comprises the step of:
   immersing the film in an aqueous etchant solution of cupric chloride and sodium chloride for a period of time sufficient to achieve the desired etching of the copper.

5. The method of claim 4 wherein the solution quantity is about 0.5 $ft^3$ etchant solution/$ft^2$ copper.

6. The method of claim 4 wherein the solution is quiescent during the immersion.

7. The method of claim 6 wherein the immersion time is about 25–30 minutes.

8. The method of claim 1 wherein the copper is vapor deposited onto a substrate.

9. The method of claim 8 wherein the copper thickness is about 0.1 mil and the solution quantity is about 0.5 $ft^3$ etchant solution/$ft^2$ copper film.

10. The product obtainable by the process of claim 1.

11. A radome using the product of claim 10.

12. The method of claim 1 wherein the mask mates with the copper film, wherein both the mask and copper film have a complex curvature, and wherein the mask includes a patterned coating adhered to a substrate that is transparent to the exposing radiation.

13. The method of claim 12 wherein the mask coating is adjacent to the copper film when the mask and film mate.

14. The method of claim 13 wherein the exposing radiation is collimated light in a frequency bandwidth that will expose the photoresist.

15. The method of claim 14 wherein the elements are at least two different sizes so that the patterned film is responsive to at least two different frequency ranges.

16. The method of claim 15 wherein the elements are slots in an otherwise continuous copper film.

17. The method of claim 16 wherein the elements are patches that are electrically isolated and adhered to a dielectric substrate.

18. The product obtainable by the process of claim 16.

19. The product obtainable by the process of claim 17.

20. A method for making precision radomes having electrical transmitting and receiving bands within at least one narrow, predetermined frequency range because of at least one accurately made frequency selective surface in the radome, comprising the steps of:
   a) vapor depositing about a 0.1 mil thin film of copper on a substrate having a complex curvature corresponding to the shape of the radome;
   b) coating the copper film with photoresist;
   c) exposing predetermined portions of the photoresist using a conformal photomask having complex curvature, the mask having transparent portions on the complexly curved surface allowing transmission of ultraviolet radiation through the mask to reach the photoresist;
   d) removing portions of the exposed photoresist to reveal underlying portions of the copper film in a predetermined pattern of crosses or Y's over the complexly curved surface;
   e) immersing the patterned photoresist-copper film-substrate combination in a quiescent tank having an aqueous solution of cupric chloride and chloride salt to etch the exposed copper precisely to within an accuracy of ±0.25 mil to yield a patterned copper film having a bandwidth sensitivity corresponding to the narrow, predetermined frequency range, wherein
     (i) the chloride salt is present in sufficient amount to negate migration effects in the solution; and
     (ii) the immersion time is about 25–30 minutes using about 0.5 $ft^3$ solution/$ft^2$ copper etched;
   f) rinsing the etched copper film;
   g) removing the remaining photoresist; and
   h) reusing the photomask.

* * * * *

UNITED STATES PATENT AND TRADEMARK OFFICE
CERTIFICATE OF CORRECTION

PATENT NO. : 5,650,249
DATED : July 22, 1997
INVENTOR(S) : D. Dull et al.

It is certified that error appears in the above-identified patent and that said Letters Patent is hereby corrected as shown below:

In claim 1, line 7 "predetermine potions" should be - - predetermined portions - -.

Signed and Sealed this

Seventh Day of October, 1997

Attest:

BRUCE LEHMAN

Attesting Officer

Commissioner of Patents and Trademarks